(12) United States Patent
Rofougaran et al.

(10) Patent No.: US 9,198,144 B2
(45) Date of Patent: Nov. 24, 2015

(54) POWER SUPPLY ADJUSTMENT AND POLAR MODULATION IN A MIMO SYSTEM

(71) Applicant: BROADCOM CORPORATION, Irvine, CA (US)

(72) Inventors: Ahmadreza Rofougaran, Newport Coast, CA (US); Maryam Rofougaran, Rancho Palos Verdes, VA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/638,383

(22) Filed: Mar. 4, 2015

(65) Prior Publication Data

US 2015/0181542 A1    Jun. 25, 2015

Related U.S. Application Data

(63) Continuation of application No. 11/876,037, filed on Oct. 22, 2007, now Pat. No. 8,995,567.

(60) Provisional application No. 60/953,100, filed on Jul. 31, 2007.

(51) Int. Cl.
*H04W 52/42* (2009.01)
*H03C 5/00* (2006.01)
*H04L 27/36* (2006.01)
*H04B 7/04* (2006.01)
(Continued)

(52) U.S. Cl.
CPC .................. *H04W 52/42* (2013.01); *H03C 5/00* (2013.01); *H04B 7/0413* (2013.01); *H04L 27/206* (2013.01); *H04L 27/361* (2013.01); *H04L 1/06* (2013.01)

(58) Field of Classification Search
CPC ........... H03C 5/00; H04L 1/06; H04L 27/361
USPC .................................. 375/260, 261, 267, 295
See application file for complete search history.

(56) References Cited

U.S. PATENT DOCUMENTS 5,420,536 A    5/1995    Faulkner et al.
6,078,628 A    6/2000    Griffith
(Continued)

OTHER PUBLICATIONS

USPTO Office Action dated Apr. 26, 2010 for U.S. Appl. No. 11/864,861, filed Sep. 28, 2007, Inventor Ahmadreza Rofougaran.
(Continued)

*Primary Examiner* — Freshteh N Aghdam
(74) *Attorney, Agent, or Firm* — Oblon, McClelland, Maier & Neustadt, L.L.P.

(57) ABSTRACT

Aspects of a method and system for power supply adjustment and polar modulation in a MIMO system are provided. In each RF transmit chain of a MIMO system that utilizes polar modulation, aspects of the invention may enable generating a signal representative of an amplitude of a pair of phase-quadrature baseband signals; and controlling a voltage and/or current regulator utilizing said generated signal. In this regard, a voltage and/or current supplied to a power amplifier and/or mixer of one or more of the transmit chains may be controlled based on the generated signal. Additionally, a gain of a power amplifier for each RF transmit chain may be controlled utilizing said signal representative of an amplitude. The signal representative of an amplitude may be generated by squaring each of the phase-quadrature baseband signals and calculating a square root of a sum of the squared signals.

15 Claims, 7 Drawing Sheets (51) Int. Cl.
*H04L 27/20* (2006.01)
*H04L 1/06* (2006.01)

(56) References Cited

U.S. PATENT DOCUMENTS

| | | | |
|---|---|---|---|
| 6,194,963 B1 * | 2/2001 | Camp et al. | 330/149 |
| 6,438,360 B1 | 8/2002 | Alberth, Jr. et al. | |
| 6,566,944 B1 | 5/2003 | Pehlke et al. | |
| 6,900,693 B2 | 5/2005 | Sasho et al. | |
| 6,996,191 B1 | 2/2006 | Meditz | |
| 7,038,540 B2 * | 5/2006 | Gurvich et al. | 330/151 |
| 7,092,683 B2 | 8/2006 | Tanaka et al. | |
| 7,457,598 B2 | 11/2008 | Zahm et al. | |
| 7,519,336 B2 | 4/2009 | Vepsalainen et al. | |
| 7,653,147 B2 * | 1/2010 | Palaskas et al. | 375/297 |
| 7,696,821 B2 | 4/2010 | Rofougaran | |
| 2003/0045243 A1 | 3/2003 | Rauhala | |
| 2005/0046507 A1 | 3/2005 | Dent | |
| 2005/0100105 A1 | 5/2005 | Jensen | |
| 2005/0159177 A1 | 7/2005 | Trachewsky et al. | |
| 2005/0195918 A1 | 9/2005 | Matsuura et al. | |
| 2006/0189285 A1 | 8/2006 | Takano et al. | |
| 2006/0227895 A1 | 10/2006 | Booth et al. | |
| 2006/0264186 A1 | 11/2006 | Akizuki et al. | |
| 2007/0184792 A1 | 8/2007 | Drogi et al. | |
| 2007/0211821 A1 | 9/2007 | Haque et al. | |
| 2007/0287393 A1 | 12/2007 | Nandipaku et al. | |
| 2008/0225984 A1 | 9/2008 | Ahmed et al. | |
| 2009/0034642 A1 | 2/2009 | Rofougaran et al. | |
| 2009/0034653 A1 | 2/2009 | Rofougaran | |
| 2009/0036072 A1 | 2/2009 | Rofougaran | |
| 2011/0312367 A1 | 12/2011 | Meiyappan | |

OTHER PUBLICATIONS

Response Under 37 C.F.R. §1.111 filed Jul. 26, 2010 in reply to Office Action dated Apr. 26, 2010 for U.S. Appl. No. 11/864,861, filed Sep. 28, 2007, Inventor Ahmadreza rofougaran.

USPTO Office Action dated Sep. 10, 2010 for U.S. Appl. No. 11/864,861, filed Sep. 28, 2007, Inventor Ahmadreza Rofougaran.

Submission Under Rule 111 Accompanying RCE under Rule 114, filed Jan. 10, 2011 in reply to USPTO Office Action dated Sep. 10, 2010 for U.S. Appl. No. 11/864,861, filed Sep. 28, 2007, Inventor Ahmadreza Rofougaran.

* cited by examiner

POWER SUPPLY ADJUSTMENT AND POLAR MODULATION IN A MIMO SYSTEM

CROSS-REFERENCE TO RELATED APPLICATIONS/INCORPORATION BY REFERENCE

The present continuation application claims the benefit of priority under 35 U.S.C. §120 from U.S. application Ser. No. 11/876,037, filed on Oct. 22, 2007, which makes reference to, claims priority to and claims benefit from U.S. Provisional Patent Application Ser. No. 60/953,100 filed on Jul. 31, 2007.

The above stated application is hereby incorporated herein by reference in its entirety.

FIELD OF THE INVENTION

Certain embodiments of the invention relate to signal processing. More specifically, certain embodiments of the invention relate to a method and system for power supply adjustment and polar modulation in a MIMO system.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for power supply adjustment and polar modulation in a MIMO system, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for power supply adjustment and polar modulation in a MIMO system. In each RF transmit chain of a MIMO system that utilizes polar modulation, aspects of the invention may enable generating a signal representative of an amplitude of a pair of phase-quadrature baseband signals; and controlling a voltage and/or current regulator utilizing the generated signal. In this regard, a voltage and/or current supplied to a power amplifier and/or mixer of one or more of the transmit chains may be controlled based on the generated signal. Additionally, a gain of a power amplifier for each RF transmit chain may be controlled utilizing the signal representative of an amplitude. The signal representative of an amplitude may be generated by squaring each of the phase-quadrature baseband signals and calculating a square root of a sum of the squared signals.

Figure 1A:
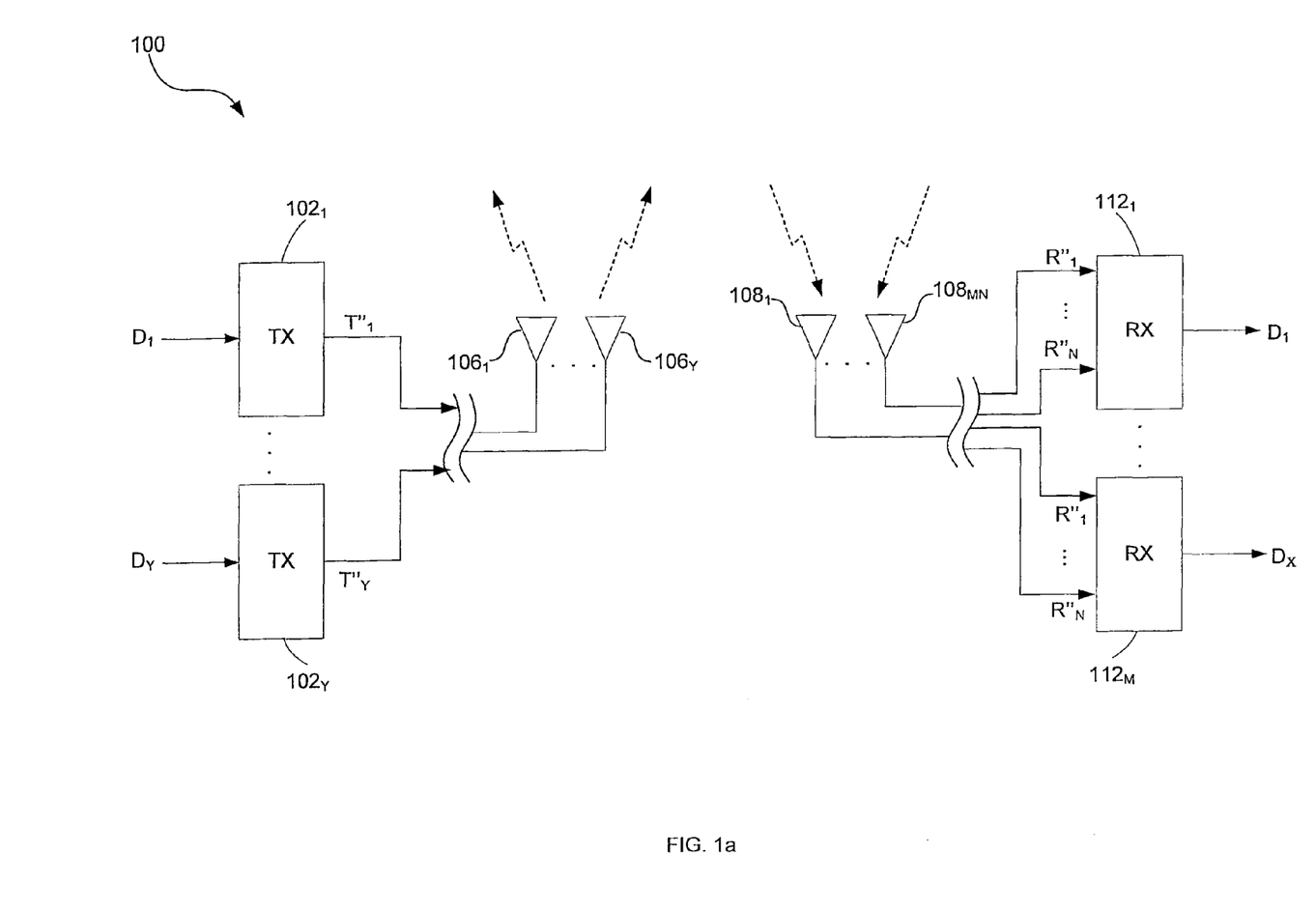
FIG. 1a is a block diagram of a MIMO system, in accordance with an embodiment of the invention.

FIG. 1a is a block diagram of a MIMO system 100 in accordance with an embodiment of the invention. Referring to FIG. 1a, the MIMO system 100 may comprise one or more RF transmit blocks $102_1, \ldots, 102_Y$, one or more transmit antennas $106_1, \ldots, 106_Y$, one or more RF receive antennas $108_1, \ldots, 108_{MN}$, and one or more RF receive blocks $112_1, \ldots, 112_M$. For example, the system 100 may comprise a number of transmit blocks Y; and each transmit block may output a signal T, which may be transmitted by Y transmit antennas. The system 100 may further comprise a number of receive blocks M, which may receive signals from M×N antennas and each receive block may operate on a number of received signals N and output a data stream $D_1$.

The RF transmit blocks $102_1, \ldots, 102_Y$ may each comprise suitable logic, circuitry and/or code that may enable processing of one or more signals which may then be transmitted. In various embodiments of the invention, the transmit blocks $102_1, \ldots, 102_Y$ perform one or more of filtering, equalizing, compressing, expanding, up-converting, modulating, amplifying, or otherwise processing signals for transmission. In this regard, additional details of an exemplary transmit block may be found in FIG. 1b.

The transmit antennas $106_1, \ldots, 106_Y$ may comprise suitable logic, circuitry, and/or code that may enable transmission of a plurality of signals in a wireless system. In one embodiment of the invention, the antennas $106_1, \ldots, 106_Y$ may enable transmission of a plurality of polar modulated signals received from the transmit blocks $102_1, \ldots, 102_Y$.

The RF receive blocks $112_1 \ldots, 112_M$ may comprise logic, circuitry and/or code that may enable processing of a plurality of received signals. In various embodiments of the invention, the transmit blocks $102_1 \ldots, 102_Y$ perform one or more of filtering, equalizing, compressing, expanding, down-converting, de-modulating, amplifying, or otherwise processing signals for reception.

The receive antennas $108_1 \ldots, 108_{MN}$ may comprise suitable logic, circuitry, and or code that may enable receiving a plurality of signals in a wireless system. In one embodiment, the receive antennas $108_1 \ldots 108_{MN}$ may enable reception of a plurality of polar modulated signals which may be processed by the receive blocks $112_1, \ldots, 112_M$.

Figure 1B:
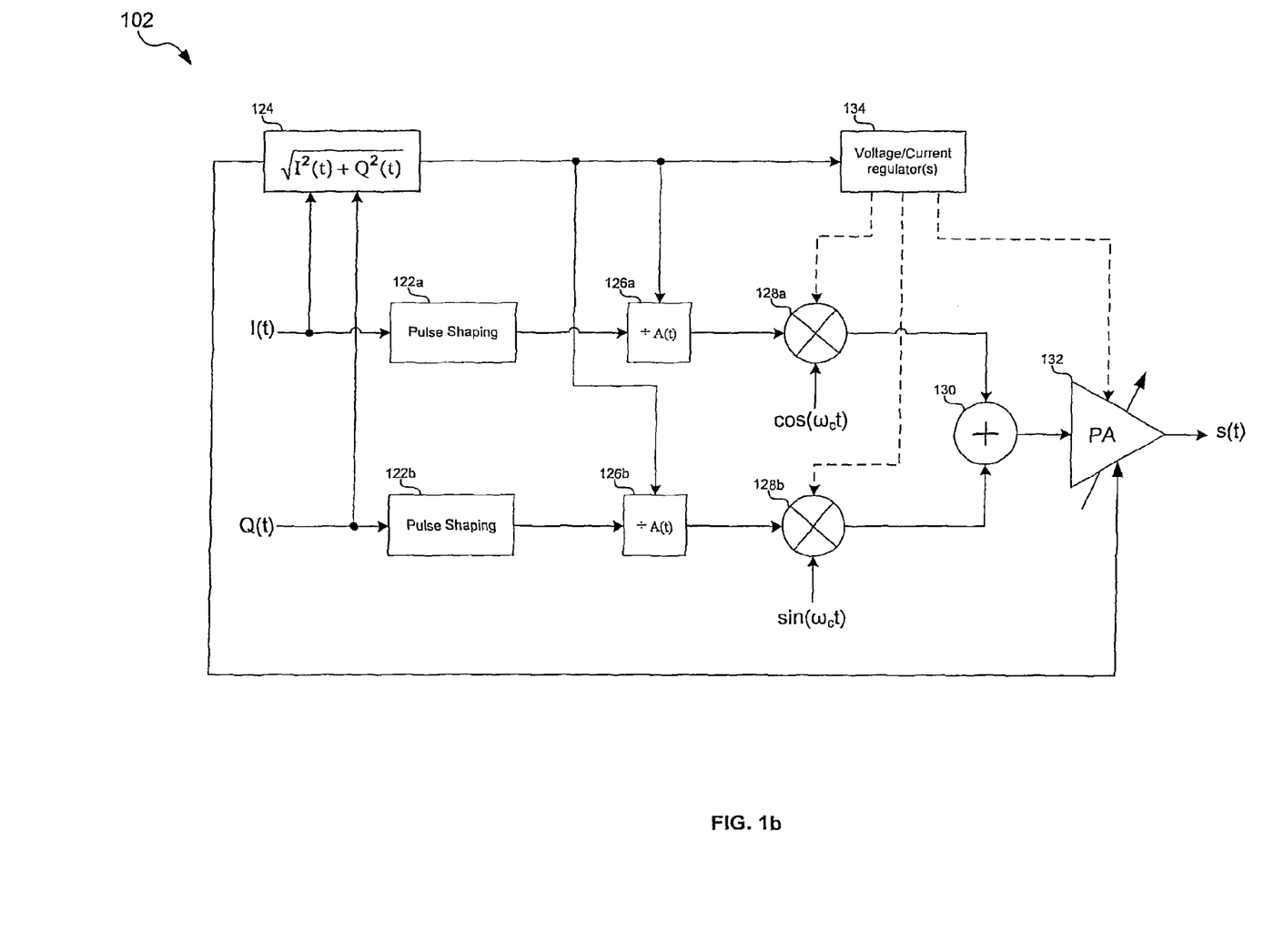
FIG. 1b is a block diagram illustrating an exemplary architecture for polar modulation and control of a power supply based on a signal amplitude in a MIMO system, in accordance with an embodiment of the invention.

FIG. 1b is a block diagram illustrating an exemplary architecture for controlling a power supply and polar modulating a signal in a MIMO system, in accordance with an embodiment of the invention. Referring to FIG. 1b there is shown at least a portion of an RF transmitter 102 comprising two pulse shaping circuits 126a and 126b, amplitude calculation block 124, division blocks 126a and 126b, mixers 128a and 128b, a summing circuit 130, and power amplifier (PA) 132.

The pulse shaping circuits 126a and 126b may comprise suitable logic, circuitry, and/or code that may enable filtering, equalizing, compressing, or otherwise processing and/or conditioning the signals I(t) and Q(t), respectively. In various embodiments of the invention, the pulse shaping may occur before or after calculating A(t).

The amplitude calculation block 124 may comprise suitable logic, circuitry, and/or code that may enable performing the following calculation:

$$A(t)=\sqrt{I^2(t)+Q^2(t)} \qquad \text{EQ. 1}$$

where I(t) and Q(t) are in-phase and quadrature-phase, respectively, components of an input baseband signal and A(t) represents an amplitude component of a polar modulated signal. In various embodiments of the invention, the calculation may be carried out in the analog domain, the digital domain, or a combination thereof. In various embodiments of the invention, the amplitude calculation block 124 may comprise one or more processors or may be implemented in one or more processors. In various embodiments of the invention, the amplitude calculation block may operate on I and Q before or after pulse shaping has been performed on I and Q.

The division blocks 126a and 126b may comprise suitable logic, circuitry, and/or code that may enable dividing one baseband signal by another. In various embodiments of the invention, the calculation may be carried out in the analog domain, the digital domain, or a combination thereof. In various embodiments of the invention, the amplitude calculation block 124 may comprise one or more processors or may be implemented in one or more processors.

The mixers 128a and 128b may comprise suitable logic, circuitry, and/or code that may enable generation of inter-modulation products resulting from the mixing of a baseband signal and a RF carrier from, for example, a local oscillator. The mixer 128a may, for example, be enabled to utilize an in-phase carrier signal to generate in-phase inter-modulation products. The mixer 128b may, for example, be enabled to utilize a quadrature phase LO signal to generate quadrature phase inter-modulation products. The frequency of the carrier signals may be determined based on the desired radio frequency for transmission. In this regard, the mixers 128a and 128b may enable up-converting, for example, baseband signals of a fixed frequency to a variable radio frequency for transmission. In various embodiments of the invention, a voltage and/or current regulator 134 supplying the mixers 128a and/or 128b may be modified based on the amplitude signal. In this manner, linearity requirements and/or efficiency of the system may be improved.

The summing circuit 130 may comprise suitable logic, circuitry, and/or code that may enable adding an in-phase component and a quadrature-phase component to generate a phase modulated RF signal. In various embodiments of the invention, the calculation may be carried out in the analog domain, the digital domain, or a combination thereof. In various embodiments of the invention, the summing circuit 130 may comprise one or more processors or may be implemented in one or more processors.

The power amplifier (PA) 132 may comprise suitable logic, circuitry, and/or code that may enable buffering and/or amplification of a RF signal and outputting the signal to an antenna for transmission. In this regard, the gain of the PA 132 may be adjustable and may enable transmitting signals of varying strength. Accordingly, the PA 132 may enable amplitude modulating an RF signal input to the PA 132. In this regard, a bias point or other adjustable parameter of the PA 132 may be controlled to vary the gain of the PA 132 resulting in amplitude modulation of the PA 132 output. Additionally, a voltage and/or current regulator 134 supplying the PA 132 may be modified based on the amplitude signal. In this manner, linearity requirements and/or efficiency of the system may be improved as described, for example, with respect to FIG. 3.

The voltage and/or current regulator 134 may comprise suitable logic circuitry, and/or code that may be a power source to one or more of the mixers 128a, 128b, and the PA 132. Additionally, the voltage and/or current regulator 134 may enable altering a voltage and/or current it supplies based on an input signal. In this regard, the voltage and/or current regulator 134 may adjust a voltage and/or current supplied to the mixers 128a and 128b, and/or the PA 132, based on the amplitude signal from the amplitude calculation block 124. In one embodiment of the invention, the output voltage and/or current of the voltage and/or current regulator 134 may scale linearly with A(t).

In operation, a baseband signal may be split into in-phase, I(t), and quadrature-phase Q(t), components. The signal components may be conveyed to the pulse shaping circuits 122a and 122b, respectively. Additionally, I(t) and Q(t) may be conveyed to the amplitude calculation block 124 where A(t) may be generated. The output of the pulse shaping blocks 122a and 122b may, respectively, be conveyed to the division blocks 126a and 126b. The division blocks 126a and 126b may divide I(t) and Q(t) by A(t) to generate I'(t) and Q'(t). I'(t) and Q'(t) may, respectively, be mixed with in-phase and quadrature-phase components of an RF carrier signal. The outputs of the mixers may then be summed to generate a carrier signal phase modulated by the baseband signal. The phase modulated signal may be conveyed to the PA 132. The gain of the PA 132 may be controlled to amplitude modulate the signal output by the PA 132. Accordingly, the signals transmitted by the PA 132 may comprise a RF carrier polar modulated by the baseband signal. Additionally, the voltage and/or current regulator 134 may scale the voltage and/or current supplied to the mixers 128a, 128b, and/or the PA 132 based on the output of the amplitude calculation block 124.

For example, when the signal from the amplitude calculation block is relatively small, a voltage and/or current supplied by the voltage and/or current regulator 134 may be reduced. Similarly, when the signal from the amplitude calculation block is relatively large, a voltage and/or current supplied by the voltage and/or current regulator 134 may be increased.

Figure 1C:
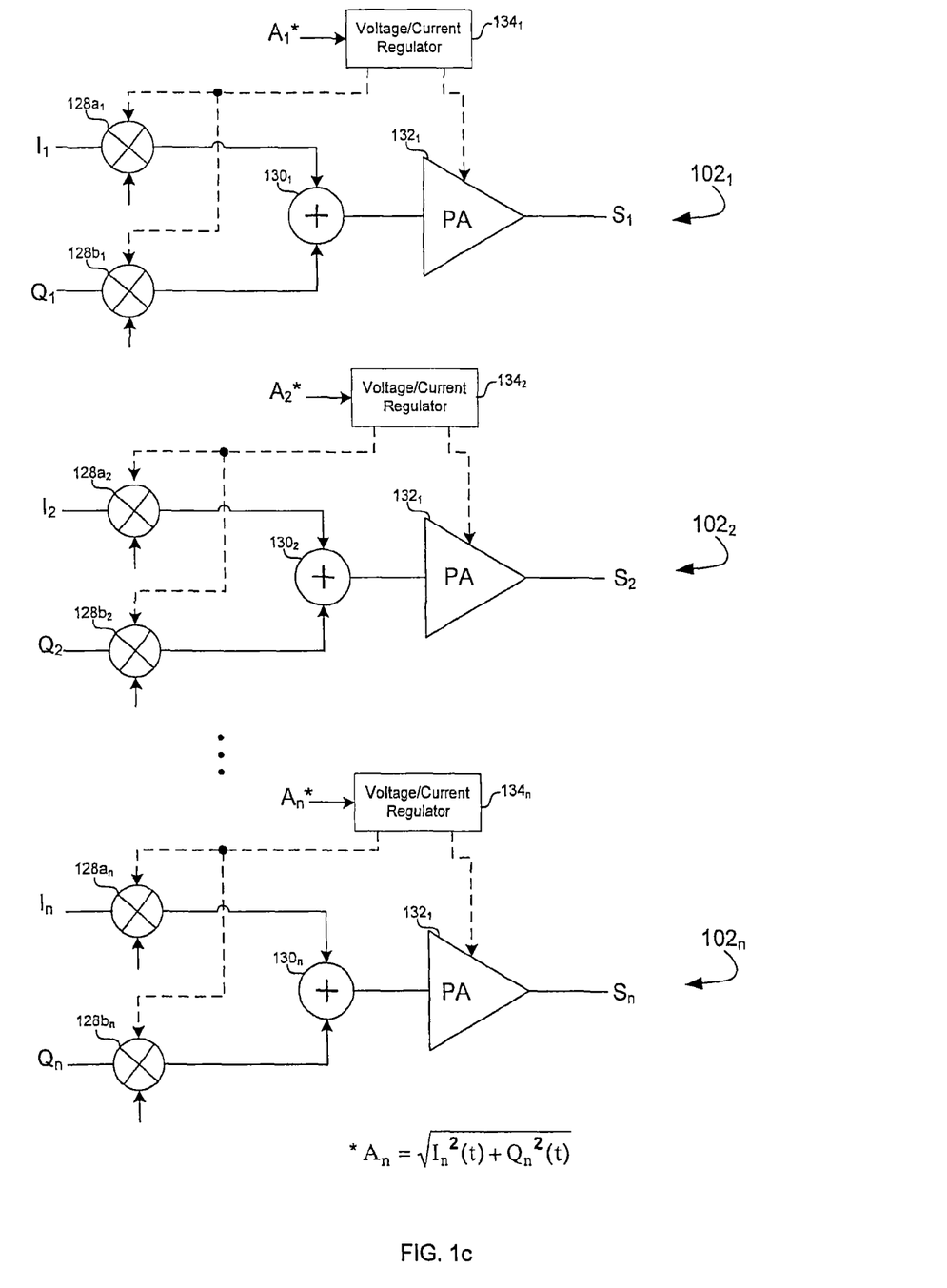
FIG. 1c is a block diagram illustrating power supply adjustment for polar modulation of RF signals in a MIMO system.

FIG. 1c is a block diagram illustrating power supply adjustment for polar modulation of RF signals in a MIMO system. Referring to FIG. 1c there is shown a portion of n RF transmit chains $102_1, \ldots, 102_n$. Each of the n RF transmit chains $102_1, \ldots, 102_n$ may comprise mixers $128a_i$ and $128b_i$ a summer 130, a power amplifier (PA) $132_i$, and one or more voltage and/or current regulators $134_i$.

An in-phase baseband signal may be coupled to a first input of each mixer $128a_i$, and a quadrature-phase component may be coupled to a first input of each mixer $128b_1$. An in-phase LO signal may be coupled to a second input of each mixer $128a_1$, and a quadrature-phase LO signal may be coupled to a second input of each mixer $128b_i$. The output of each mixer $128a_i$ and $128b_i$ may be coupled to an input of the summer $130_i$. The output of the summer $130_i$ may be coupled to an input of the PA $132_i$. Each mixer $128a_i$ and $128b_i$ and each PA $132_i$ may be coupled to a voltage and/or current regulator $134_i$, which, in turn, may be coupled to an amplitude calculation block, such as the amplitude calculation block 124 described with respect to FIG. 1b.

In operation, a baseband signal to be transmitted via a transmit chain 102; may be split into in-phase, 1(t), and quadrature-phase Q(t), components. The signal components may be conditioned, for example, by one or more pulse shaping circuits. Additionally, an amplitude component, $A_i$, of a polar representation of the baseband signal may be calculated. Moreover, the components 1(t); and Q(t); may be divided by $A_1$, up-converted, and subsequently combined to generate a signal representative of a phase portion of a polar representation of the baseband signal. The signal representative of a phase may be input to a PA $132_i$ for amplification. Additionally, the output of the PA $132_i$ may be amplitude modulated such that the transmitted signal, $S_i$, may be a carrier that is polar modulated by the input baseband signal. Accordingly, the signal transmitted by each PA $132_i$ may comprise a RF carrier polar modulated by the baseband signal. In various embodiments of the invention, the voltage and/or current regulator block $134_i$ may be adjusted based on the signal $A_i$. For example, the supply voltage of PA $312_i$ may scale linearly with the signal $A_i$ such that $S_i$ is amplitude modulated by $A_i$ or a signal proportional to $A_i$.

Figure 2A:
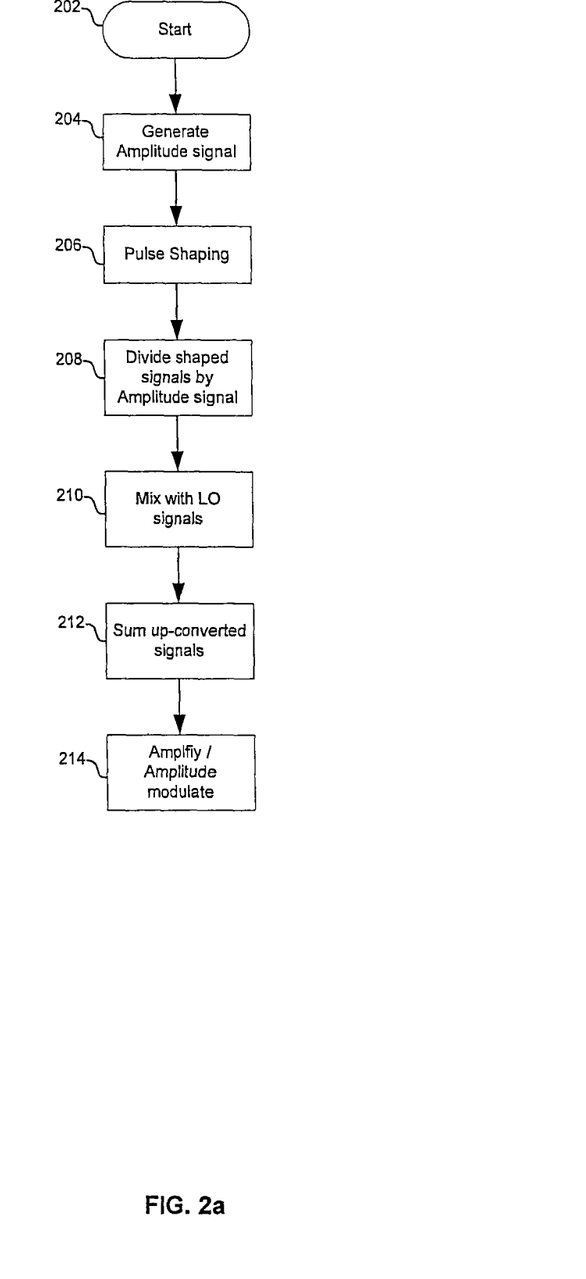
FIG. 2a is a flow chart illustrating exemplary steps for controlling a gain of a power amplifier (PA) for amplitude modulating an output of the PA in a MIMO system, in accordance with an embodiment of the invention

FIG. 2a is a flow chart illustrating exemplary steps for controlling a gain of a PA for amplitude modulating an output of the PA in a MIMO system, in accordance with an embodiment of the invention. Referring to FIG. 2a, the exemplary steps may begin with start step 202. Subsequent to step 202, the exemplary steps may advance to step 204. In step 204, a signal, $A_i$, representative of the amplitude of a pair of phase quadrature baseband signals $I_i$ and $Q_i$ may be generated for each transmit chain $102_i$ in a MIMO transmitter. In this regard, EQ. 1 above may be utilized to generate the each amplitude signal. Subsequent to step 204, the exemplary steps may advance to step 206. In step 206, the signals $I_i$ and $Q_i$ may be processed by a pulse shaping block. For example, each of the signals ${}_i$; and $Q_i$ may be filtered, equalized, and/or compressed. Subsequent to step 206, the exemplary steps may advance to step 208. In step 208, the signals $I'_i$ and $Q'_i$ may each be divided by the amplitude signal $A_i$ generated in step 204, resulting in signals, $I'_i$ and $Q'_i$. Subsequent to step 208, the exemplary steps may advance to step 210. In step 210, the signals I' and Q' may be mixed with in-phase and quadrature-phase LO signals, respectively, to up-convert the signals to RF. In various embodiments of the invention, each transmit chain $102_i$ may utilize LO signals with different frequencies and/or phases. Subsequent to step 210, the exemplary steps may advance to step 212. In step 212, the up-converted signals of each transmit chain $102_i$ may be combined to generate a phase modulated RF signal for each transmit chain $102_i$. Subsequent to step 212, the exemplary steps may advance to step 214. In step 214, each phase modulated signal resulting from step 212 may be amplified for transmission by the power amplifier $132_i$. Moreover, the gain of each amplifier $132_i$ may be controlled, based on the amplitude signal generated in step 204, to amplitude modulate the output of the PA $132_i$. In this manner, a polar modulated signal may be generated by each transmit chain $102_i$ comprising a MIMO wireless device.

Figure 2B:
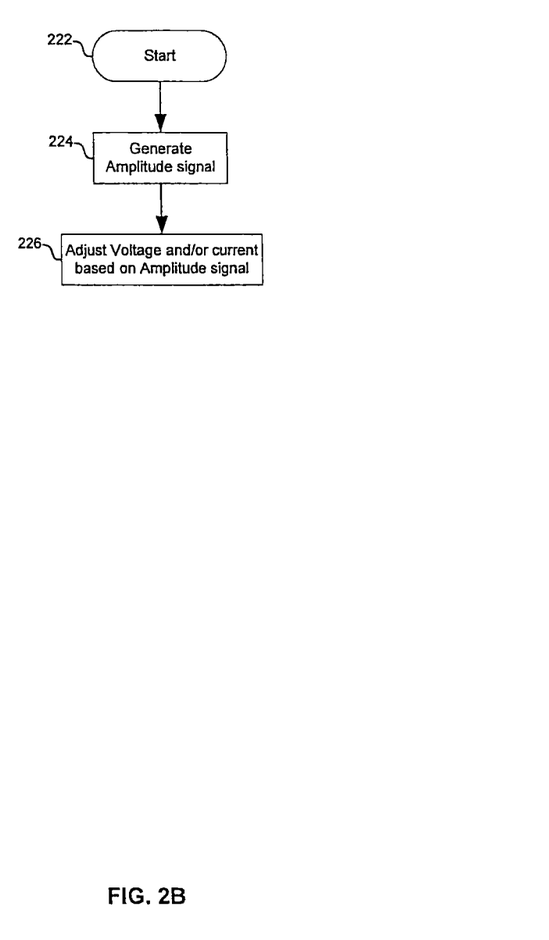
FIG. 2b is a flow chart illustrating exemplary steps for controlling a power supply to improve transmitter efficiency in a MIMO system, in accordance with an embodiment of the invention

FIG. 2b is a flow chart illustrating exemplary steps for controlling a power supply to improve transmitter efficiency in a MIMO system, in accordance with an embodiment of the invention. Referring to FIG. 2b, the exemplary steps may begin with start step 222. Subsequent to step 222, the exemplary steps may advance to step 224. In step 224, a signal, A, representative of the amplitude of the signals $I_i$ and $Q_i$ may be generated for each transmit chain $102_i$ in a MIMO wireless device. In this regard, EQ. 1 above may be utilized to generate each amplitude signal. Subsequent to step 224, the exemplary steps may advance to step 226. In step 226, a voltage and/or current supplying a power amplifier and/or mixers of each transmit chain $102_i$ may be adjusted based on the amplitude of A. For example, a supply voltage to the PA $132_i$ may be increased when the amplitude is relatively low and the supply voltage to the PA $132_i$ may be increased when the amplitude is relatively high. In this manner, efficiency of the PA $132_i$ may be improved over conventional methods and systems as, for example, described with respect to FIG. 3.

Figure 3:
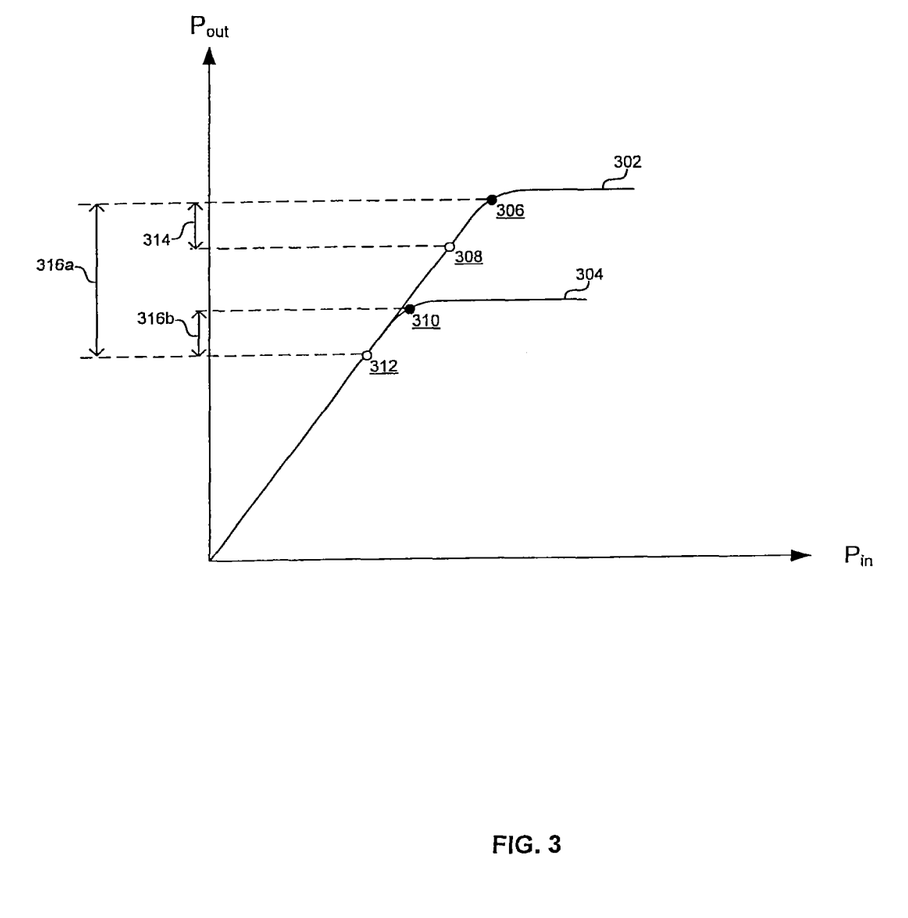
FIG. 3 is a diagram illustrating exemplary transfer characteristics of a PA for different supply voltages, in accordance with an embodiment of the invention.

FIG. 3 is a diagram illustrating exemplary transfer characteristics of a PA for different supply voltages, in accordance with an embodiment of the invention. Referring to FIG. 3 there is shown a PA transfer characteristic 302 and 1 dB compression point 306 corresponding to a higher supply voltage, a PA transfer characteristic 304 and 1 dB compression point 310 corresponding to a lower supply voltage, an operating point 308 corresponding to higher PA output levels, and an operating point 312 corresponding to lower PA output levels.

In operation, if a PA is always powered with a higher supply voltage, then the transfer characteristic of the PA may always be the characteristic 302. Accordingly, when the output levels of the PA are around point 312, the PA will be significantly less power efficient, than when output levels of the PA are around the point 308. In this regard, a determinant of PA efficiency may be the difference between the operating point and the 1 dB compression point. Accordingly, an operating point closer to the 1 db compression point may equate to improved power efficiency. For example, the difference 316a between points 306 and 312 may be significantly greater than the difference 314 between points 306 and 308. Accordingly, when operating around the point 312, reducing the supply voltage of the PA such that the 1 dB compression point is moved to the point 310, then the efficiency of the PA may be improved. In this regard, the distance 316b between the points 310 and 312 may be significantly less than the distance 316a. Accordingly, in a MIMO system, components of each transmit chain 120; may be operated at a voltage and/or current level that increases power efficiency for that chain. In this manner, overall efficiency of a MIMO wireless device may be improved by separately controlling voltage and/or current levels for each transmit chain.

Figure 4:
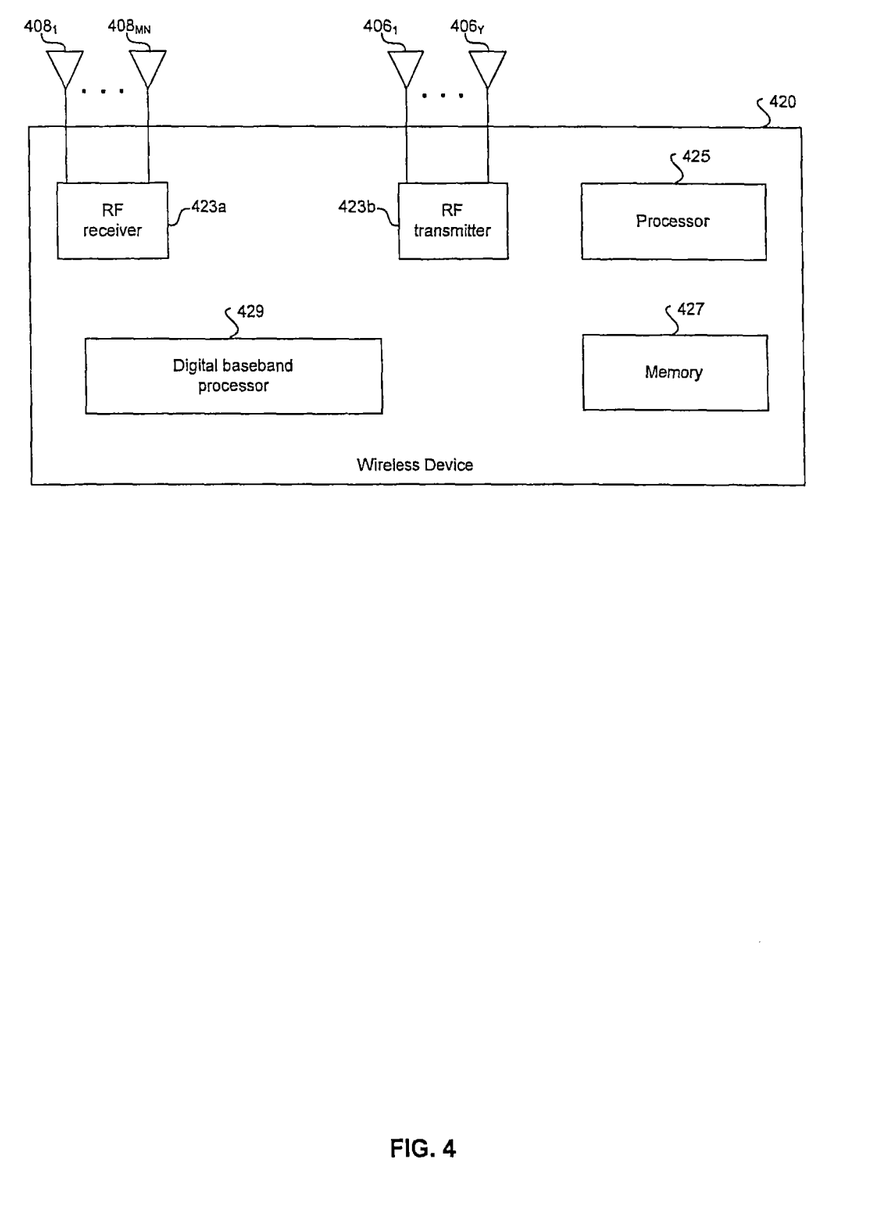
FIG. 4 is a block diagram illustrating an exemplary MIMO wireless device, in accordance with an embodiment of the invention.

FIG. 4 is a block diagram illustrating an exemplary MIMO wireless device, in accordance with an embodiment of the invention. Referring to FIG. 4, there is shown a wireless device 420 that may comprise an RF receiver 423a, an RF transmitter 423b, a digital baseband processor 429, a processor 425, and a memory 427. Receive antennas $408_1, \ldots, 408_{MN}$ may be communicatively coupled to the RF receiver 423a. Transmit antennas $406_1, \ldots, 406_Y$ may be communicatively coupled to the RF transmitter 423b. The wireless device 420 may be operated in a system, such as a cellular network and/or digital video broadcast network, for example.

The RF receiver 423a may comprise suitable logic, circuitry, and/or code that may enable processing of received RF signals. The RF receiver 423a may enable receiving RF signals in a plurality of frequency bands. For example, the RF receiver 423a may enable receiving signals in cellular frequency bands. Each frequency band supported by the RF receiver 423a may have a corresponding front-end circuit for handling low noise amplification and down conversion operations, for example. In this regard, the RF receiver 423a may be referred to as a multi-band receiver when it supports more than one frequency band. In another embodiment of the invention, the wireless device 420 may comprise more than one RF receiver 423a, wherein each of the RF receivers 423a may be a single-band or a multi-band receiver. In this regard, the receiver 423a may comprise the receive blocks $112_1, \ldots, 112_M$, which are described with respect to FIG. 1.

The RF receiver 423a may down convert the received RF signal to a baseband signal that comprises an in-phase (I) component and a quadrature (Q) component. The RF receiver 423a may perform direct down conversion of the received RF signal to a baseband signal, for example. In some instances, the RF receiver 423a may enable analog-to-digital conversion of the baseband signal components before transferring the components to the digital baseband processor 429. In other instances, the RF receiver 423a may transfer the baseband signal components in analog form.

The digital baseband processor 429 may comprise suitable logic, circuitry, and/or code that may enable processing and/or handling of baseband signals. In this regard, the digital baseband processor 429 may process or handle signals received from the RF receiver 423a and/or signals to be transferred to the RF transmitter 423b, when the RF transmitter 423b is present, for transmission to the network. The digital baseband processor 429 may also provide control and/or feedback information to the RF receiver 423a and to the RF transmitter 423b based on information from the processed signals. In this regard, the baseband processor may provide a control signal to one or more of the pulse shaping blocks 122a and 122b, the amplitude calculation block 124, the division blocks 126a and 126b, the mixers 128a and 128b, voltage and/or current regulator 134, the summer 130, and/or the PA 132. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423b for transmission to the network.

The RF transmitter 423b may comprise suitable logic, circuitry, and/or code that may enable processing of RF signals for transmission. The RF transmitter 423b may enable transmission of RF signals in a plurality of frequency bands. For example, the RF transmitter 423b may enable transmitting signals in cellular frequency bands. Each frequency band supported by the RF transmitter 423b may have a corresponding front-end circuit for handling amplification and up conversion operations, for example. In this regard, the RF transmitter 423b may be referred to as a multi-band transmitter when it supports more than one frequency band. In another embodiment of the invention, the wireless device 420 may comprise more than one RF transmitter 423b, wherein each of the RF transmitter 423b may be a single-band or a multi-band transmitter. In this regard, the receiver 423a may comprise a plurality of the transmit blocks $102_1, \ldots, 102_Y$, which are described with respect to FIG. 1.

The RF transmitter 423b may quadrature up convert the baseband signal comprising I/Q components to an RF signal. The RF transmitter 423b may perform direct up conversion of the baseband signal to a RF signal, for example. The RF transmitter may be enabled to polar modulate one or more carrier signals by the baseband signal. Accordingly, the RF transmitter 423b may comprise a plurality of transmit chains, such as the transmit chains $120_1, \ldots, 120_n$ described with respect to FIG. 1c. In this regard, the RF transmitter may be enabled to separate the generation of phase and amplitude components of a signal to be transmitted. In this manner, the RF transmitter may be enabled to perform phase modulation independent of amplitude modulation. For example, the output of the summers $130_1, \ldots, 130_n$, as described with respect to FIG. 1c, may comprise phase modulated signals which are subsequently amplitude modulated by controlling a gain of the power amplifiers $132_1, \ldots, 132_n$. Moreover, power efficiency of the RF transmitter 423b may be improved by controlling one or more voltages and/or currents supplied to components of one or more of the transmit chains $120_1, \ldots, 120_n$, as described with respect to FIG. 1c. In some instances, the RF transmitter 423b may enable digital-to-analog conversion of the baseband signal components received from the digital baseband processor 429 before up conversion. In other instances, the RF transmitter 423b may receive baseband signal components in analog form.

The processor 425 may comprise suitable logic, circuitry, and/or code that may enable control and/or data processing operations for the wireless device 420. The processor 425 may be utilized to control at least a portion of the RF receiver 423a, the RF transmitter 423b, the digital baseband processor 429, and/or the memory 427. In this regard, the processor 425 may generate at least one signal for controlling operations within the wireless device 420. In this regard, the baseband processor may provide a control signal to one or more of the pulse shaping blocks 122a and 122b, the amplitude calculation block 124, the division blocks 126a and 126b, the mixers 128a and 128b, voltage and/or current regulator 134, the summer 130, and/or the PA 132. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the RF receiver 423a to enable receiving cellular transmission in the appropriate frequency band. In this regard, the baseband processor may store control and/or configuration information for one or more of the pulse shaping blocks 122a and 122b, the amplitude calculation block 124, the division blocks 126a and 126b, the mixers 128a and 128b, voltage and/or current regulator 134, the summer 130, and/or the PA 132.

Aspects of a method and system for power supply adjustment and polar modulation in a MIMO system are provided. In each RF transmit chain $102_i$ of a MIMO system that utilizes polar modulation, such as the MIMO wireless device described with respect to FIG. 4, aspects of the invention may enable generating a signal, $A_i$, representative of an amplitude of a pair of phase-quadrature baseband signals; and controlling a voltage and/or current regulator $134_i$ utilizing said generated signal. In this regard, a voltage and/or current supplied to a power amplifier $132_i$ and/or mixers $128a_i$ and $128b_i$ of one or more of the transmit chains $102_i$ may be controlled based on the generated signal. Additionally, a gain of a power amplifier for said each RF transmit chain may be controlled utilizing said signal representative of an amplitude, to enable amplitude modulating the output of the PA. The signal representative of an amplitude may be generated by squaring each of the phase-quadrature baseband signals and calculating a square root of a sum of the squared signals.

Another embodiment of the invention may provide a machine-readable storage, having stored thereon, a computer program having at least one code section executable by a machine, thereby causing the machine to perform the steps as described herein for power supply adjustment and polar modulation in a MIMO system.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
    in each radio frequency (RF) transmit chain of a multiple input multiple output (MIMO) system that utilizes polar modulation
        generating a signal representative of an amplitude of a pair of phase-quadrature baseband signals;
        controlling a supply voltage or a supply current generated by a voltage regulator or a current regulator, the supply voltage or the supply current being linearly proportional to a square root of a sum of the pair of squared phase-quadrature baseband signals; and
        modifying a power transfer curve of an amplifier of said RF transmit chain of said MIMO system according to the supply voltage or the supply current linearly proportional to the square root of the sum of the pair of squared phase-quadrature baseband signals, wherein
        the power transfer curve of the amplifier of each RF transmit chain is modified independently of other RF transmit chains and according to the supply voltage or the supply current.

2. The method according to claim 1, further comprising, in each RF transmit chain of the MIMO system,
    performing pulse shaping respectively on the pair of phase-quadrature baseband signals;
    dividing each of the pulse-shaped pair of phase-quadrature baseband signals by the signal representative of the amplitude of the pair of phase-quadrature baseband signals; and
    mixing each of the divided pair of phase-quadrature baseband signals with a radio frequency (RF) carrier signal to generate a radio frequency signal.

3. The method according to claim 2, further comprising, in each RF transmit chain of the MIMO system,
    summing the radio frequency signals generated from each of the pair of phase-quadrature baseband signals to generate a phase modulated radio frequency signal,
    amplifying the phase modulated radio frequency signal using the amplifier, and
    transmitting the amplified phase modulated radio frequency signal.

4. The method according to claim 2, wherein modifying the power transfer curve of the amplifier includes modifying a compression point of the amplifier according to the supply voltage or the supply current linearly proportional to the square root of the sum of the pair of squared phase-quadrature baseband signals.

5. The method according to claim 2, further comprising, in each RF transmit chain of the MIMO system,
    supplying a second supply voltage to mixers performing the mixing, wherein the second supply voltage is linearly proportional to the square root of the sum of the pair of squared phase-quadrature baseband signals.

6. A non-transitory computer-readable storage medium storing instructions thereon, which, when executed by a computer, cause the computer to perform a method comprising:
    in each radio frequency (RF) transmit chain of a multiple input multiple output (MIMO) system that utilizes polar modulation
        generating a signal representative of an amplitude of a pair of phase-quadrature baseband signals;
        controlling a supply voltage or a supply current generated by a voltage regulator or a current regulator, the supply voltage or the supply current being linearly proportional to a square root of a sum of the pair of squared phase-quadrature baseband signals; and
        modifying a power transfer curve of an amplifier of said RF transmit chain of said MIMO system according to the supply voltage or the supply current linearly proportional to the square root of the sum of the pair of squared phase-quadrature baseband signals, wherein the power transfer curve of the amplifier of each RF transmit chain is modified independently of other RF transmit chains and according to the supply voltage or the supply current.

7. The non-transitory computer-readable storage medium according to claim 6, further comprising, in each RF transmit chain of the MIMO system,
performing pulse shaping respectively on the pair of phase-quadrature baseband signals;
dividing each of the pulse-shaped pair of phase-quadrature baseband signals by the signal representative of the amplitude of the pair of phase-quadrature baseband signals; and
mixing each of the divided pair of phase-quadrature baseband signals with a radio frequency (RF) carrier signal to generate a radio frequency signal.

8. The non-transitory computer-readable storage medium according to claim 7, further comprising, in each RF transmit chain of the MIMO system,
summing the radio frequency signals generated from each of the pair of phase-quadrature baseband signals to generate a phase modulated radio frequency signal,
amplifying the phase modulated radio frequency signal using the amplifier, and
transmitting the amplified phase modulated radio frequency signal.

9. The non-transitory computer-readable storage medium according to claim 7, wherein modifying the power transfer curve of the amplifier includes modifying a compression point of the amplifier according to the supply voltage or the supply current linearly proportional to the square root of the sum of the pair of squared phase-quadrature baseband signals.

10. The non-transitory computer-readable storage medium according to claim 7, further comprising, in each RF transmit chain of the MIMO system,
supplying a second supply voltage to mixers performing the mixing, wherein the second supply voltage is linearly proportional to the square root of the sum of the pair of squared phase-quadrature baseband signals.

11. A signal processing system, the system comprising:
circuitry in each radio frequency (RF) transmit chain of a multiple input multiple output (MIMO) system that utilizes polar modulation, the circuitry being configured to
generate a signal representative of an amplitude of a pair of phase-quadrature baseband signals;
control a supply voltage or a supply current generated by a voltage regulator or a current regulator, the supply voltage or the supply current being linearly proportional to a square root of a sum of the pair of squared phase-quadrature baseband signals; and
modify a power transfer curve of an amplifier of said RF transmit chain of said MIMO system according to the supply voltage or the supply current linearly proportional to the square root of the sum of the pair of squared phase-quadrature baseband signals, wherein
the power transfer curve of the amplifier of each RF transmit chain is modified independently of other RF transmit chains and according to the supply voltage or the supply current.

12. The system according to claim 11, wherein the circuitry is further configured to
perform pulse shaping respectively on the pair of phase-quadrature baseband signals;
divide each of the pulse-shaped pair of phase-quadrature baseband signals by the signal representative of the amplitude of the pair of phase-quadrature baseband signals; and
mix each of the divided pair of phase-quadrature baseband signals with a radio frequency (RF) carrier signal to generate a radio frequency signal.

13. The system according to claim 12, wherein the circuitry is further configured to
sum the radio frequency signals generated from each of the pair of phase-quadrature baseband signals to generate a phase modulated radio frequency signal,
amplify the phase modulated radio frequency signal using the amplifier, and
transmit the amplified phase modulated radio frequency signal.

14. The system according to claim 12, wherein modifying the power transfer curve of the amplifier includes modifying a compression point of the amplifier according to the supply voltage or the supply current linearly proportional to the square root of the sum of the pair of squared phase-quadrature baseband signals.

15. The system according to claim 12, wherein the circuitry is further configured to
supply a second supply voltage to mixers performing the mixing, wherein the second supply voltage is linearly proportional to the square root of the sum of the pair of squared phase-quadrature baseband signals.

* * * * *